(12) United States Patent
Cugini et al.

(10) Patent No.: US 6,369,591 B1
(45) Date of Patent: Apr. 9, 2002

(54) APPARATUS AND METHOD USING PHOTOELECTRIC EFFECT FOR TESTING ELECTRICAL TRACES

(75) Inventors: Mario A. Cugini, Vista; Jeff Brakley, San Diego; Gilbert Norman Ravich, Lawndale; George E. Miles, III, San Diego; Ralph Lynn Giusti, Vista, all of CA (US)

(73) Assignee: Maniatech Incorporated, Santa Ana, CA (US)

( * ) Notice: Subject to any disclaimer, the term of this patent is extended or adjusted under 35 U.S.C. 154(b) by 0 days.

(21) Appl. No.: 09/461,801

(22) Filed: Dec. 15, 1999

Related U.S. Application Data

(63) Continuation-in-part of application No. 09/231,410, filed on Jan. 14, 1999.

(51) Int. Cl.[7] ............................................ G01R 31/302
(52) U.S. Cl. ..................................................... 324/752
(58) Field of Search ........................... 324/752, 158 R; 250/492.2, 310; 156/345; 356/369; 438/8

(56) References Cited

U.S. PATENT DOCUMENTS

| | | | |
|---|---|---|---|
| 3,796,947 A | 3/1974 | Harrod et al. | 324/51 |
| 4,721,910 A | * 1/1988 | Bokor et al. | 324/158 R |
| 4,837,506 A | 6/1989 | Patterson | 324/158.1 |
| 4,967,152 A | 10/1990 | Patterson | 324/158.1 |
| 5,563,508 A | * 10/1996 | Tatah | 324/158.1 |
| 6,011,402 A | 1/2000 | Kuo et al. | 324/753 |
| 6,154,038 A | * 11/2000 | Ito et al. | 324/750 |

FOREIGN PATENT DOCUMENTS

| | | |
|---|---|---|
| EP | 0104577 | 4/1984 |

OTHER PUBLICATIONS

*Photoelectric Phenomena*, Arthur Llewelyn Hughes, D. Sc., pp. 4–1 to 4–6, 1932.

"Photoemission from gold thin films for application in multiphotocathode arrays for electron beam lithography," Xinrong Jiang, C.N. Berglund, and Anthony E. Bell, William A. Mackie, *J. Vac. Sci. Technol.* B16(6), pp. 3375–3379, Nov./Dec. 1998.

*Optical Properties of Solids*, Frederick Wooten, pp. 8–11, 1972.

*Photomultiplier Handbook*, 1980 Edition, pp. 17–18.

* cited by examiner

*Primary Examiner*—Safet Metjahic
*Assistant Examiner*—Etienne LeRoux
(74) *Attorney, Agent, or Firm*—Gregory S. Rosenblatt; Jody Lynn DeStefanis; Wiggin & Dana

(57) ABSTRACT

A tester for electrical traces such as on a circuit board generally comprises an electromagnetic beam source such as a laser producing an ultraviolet beam, a vacuum chamber, an electrode circuit including electrodes and corresponding electronics including ammeters for measuring photoelectron flow between traces and electrodes, a controller, laser beam optics, an image acquisition system, and a pair of broadband UV lights. The board containing traces under test is disposed in the vacuum chamber at lowered pressure with grid electrodes lying close to the trace area on each side of the board. Electrode electronics selectively maintain a known potential on each electrode. The exact location of traces are determined by an image acquisition system. The board and traces are initialized to a known voltage. Photoelectric effect using ultraviolet laser beams is used to determine continuity between two points on a trace and shorts between traces.

17 Claims, 5 Drawing Sheets

APPARATUS AND METHOD USING PHOTOELECTRIC EFFECT FOR TESTING ELECTRICAL TRACES

CROSS-REFERENCE TO RELATED APPLICATIONS

This application is a continuation-in-part of copending application Ser. No. 09/231,410 filed Jan. 14, 1999 titled APPARATUS AND METHOD USING PHOTOELECTRIC EFFECT FOR TESTING ELECTRICAL TRACES.

FIELD OF THE INVENTION

This invention relates to testing electrical traces, such as on a substrate, such as a circuit board, for characteristics such as opens, shorts, neck-downs, or improper etching; and more specifically relates to a test method using photoelectric effect.

BACKGROUND OF THE INVENTION

In the manufacture of electronic components, the packaging density has increased considerably, resulting in extremely narrow and thin traces disposed on both sides of the substrates with numerous connections from one side to the other. Fabrication of such fine traces is difficult such that defects are more common. Therefore, testing the quality of fine traces on both sides and connections from one side to the other of a substrate has become increasingly more important.

Most conventional methods of trace testing involve physically contacting the trace with one or two test probes. The physical placement accuracy and the physical size of test probes limit their use in testing in mass. Many current traces are so small or densely packed that they can only be connected with a physical probe individually with a very time consuming and uneconomical process. Even if contact probes are available and can be used in a production mode, the act of contacting, more specifically the force required to make a good electrical contact is high enough to inflict permanent damage to thin traces, rendering them useless.

Therefore there has been a need for a test apparatus and method for opens, shorts, neck-downs, or improper etching in which the trace is not physically contacted and which is not unduly time consuming.

SUMMARY OF THE INVENTION

This invention is a tester for electrical traces such as on a circuit board, and the preferred embodiment generally comprises a laser producing an ultraviolet beam, a vacuum chamber, an electrode circuit including electrodes and corresponding electronics including ammeters for measuring photoelectron flow between traces and electrodes, a controller, laser beam optics, an image acquisition system, and a pair of broadband UV lights.

The board containing traces under test is disposed in the vacuum chamber at lowered pressure with grid electrodes lying over the trace area on each side of the board. Electrode electronics selectively maintain a known potential on each electrode. The exact location of traces are determined by an image acquisition system.

The traces are initialized to a known voltage such as by: (1) the induced high voltage method by first applying a relatively high positive voltage to one electrode and a high negative voltage to the other electrode, then reversing the polarity of the voltages; (2) simultaneous photoelectron effect illumination of electrodes by setting both electrodes to a known positive voltage and irradiating electrodes, board and traces by the broadband UV electromagnetic sources; or (3) laser method by setting electrodes to a known voltage and dithering the laser beam so as to strike a portion of electrode and a trace. Shining the laser beam on a location so as to liberate photoelectrons is referred to as "interrogating".

Continuity between two points on a trace is determined by interrogating the first location until it is charged to a known voltage and then by interrogating the second location.

Shorts between traces can be determined by interrogating a first trace until it is charged to a known voltage and then interrogating the second trace.

Other features and many attendant advantages of the invention will become more apparent upon a reading of the following detailed description together with the drawings wherein like reference numerals refer to like parts throughout.

DETAILED DESCRIPTION OF THE INVENTION

Figure 1:
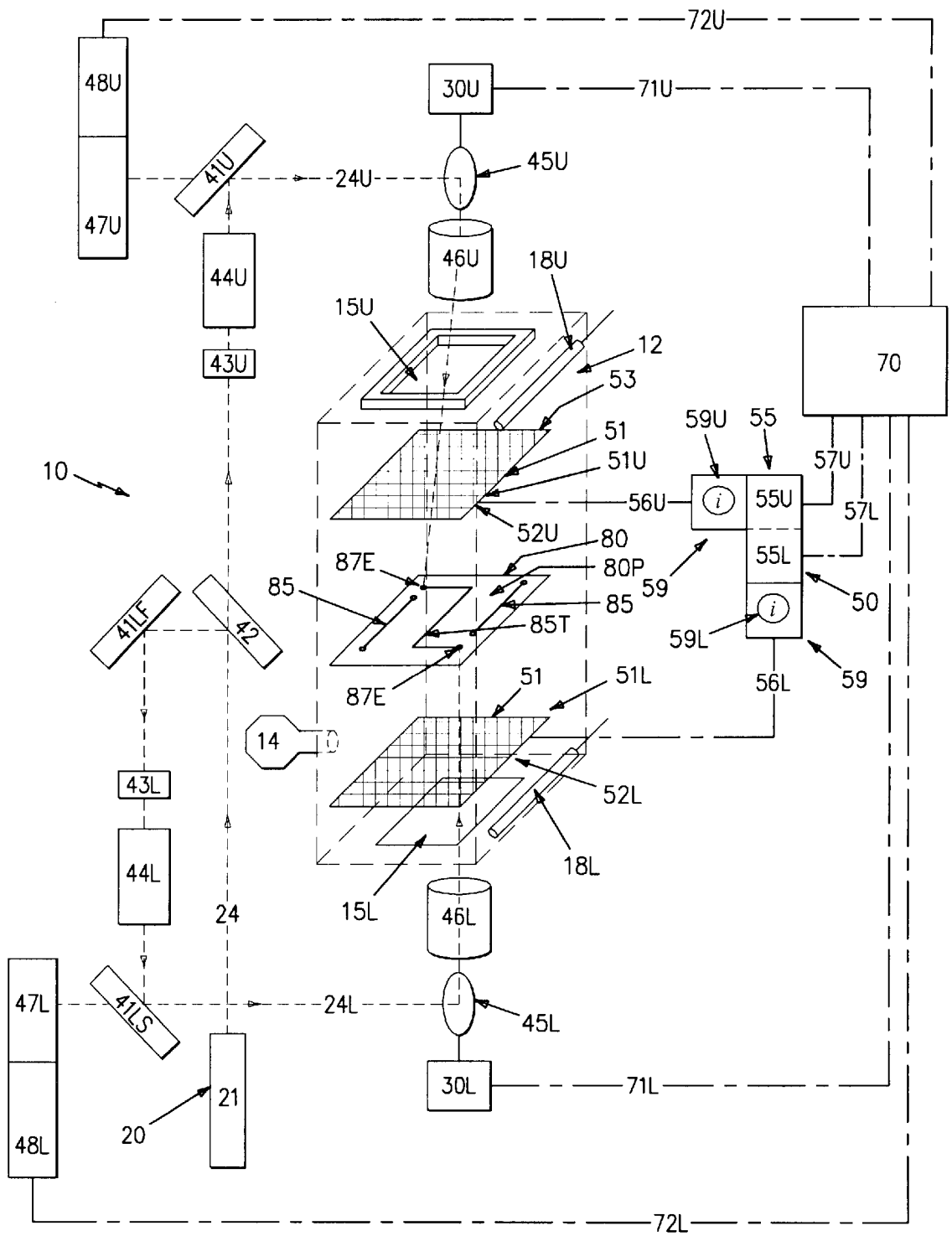
FIG. 1 is a schematic representation of a preferred embodiment of the trace tester of the invention.
Figure 5:
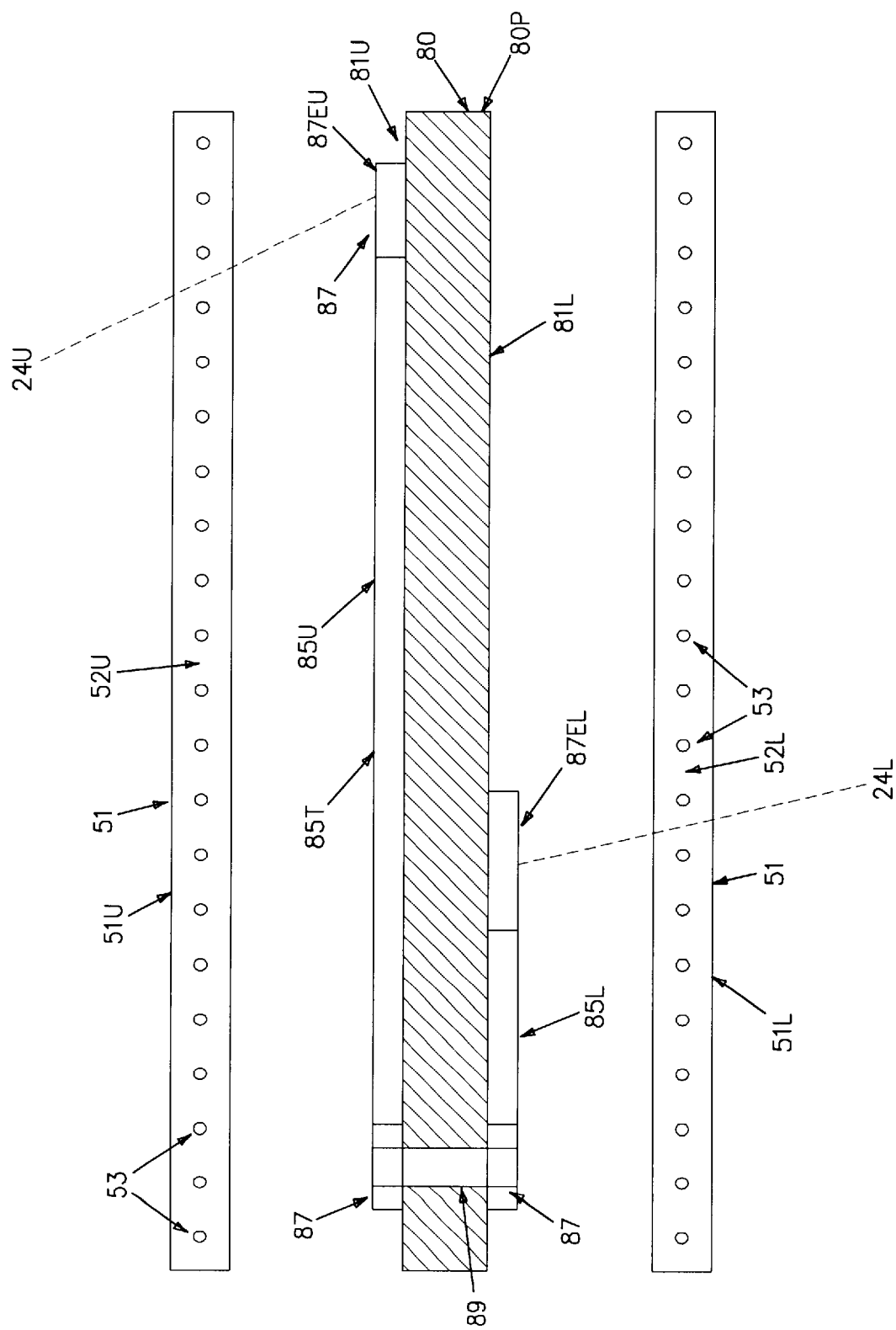
FIG. 5 is an enlarged vertical cross-sectional representation of a representative substrate and nearby elements.

As best seen in FIGS. 1 and 5, a substrate 80, such as printed circuit board 80P having an upper side 81U and a lower side 81L, contains electrical traces 85 to be tested. A given trace 85 may include upper portions 85U on board upper side 81U and lower portions 85L on board lower side 81L. Each trace 85 includes pads 87 for attachment of electrical components and, typically, at the end of each trace 85 is an end pad 87E, such as upper end pad 87EU and lower end pad 87EL. Typically, a trace 85 passes from upper side 81U to lower side 81L through plated through holes 89.

Tester 10, as shown, tests traces 85 on both upper and lower sides 81U, 81L of board 80P. Obvious modifications can be made to tester 10 to test traces 85 on only one side of board 80P.

Trace tester 10 generally comprises an electromagnetic source means 20, vacuum chamber means 12, an electrode circuit 50 including electrodes 51 and corresponding electronics 55, controller 70 and a plurality of broadband electromagnetic source means 18, such as pair 18U, 18L.

Figure 2:
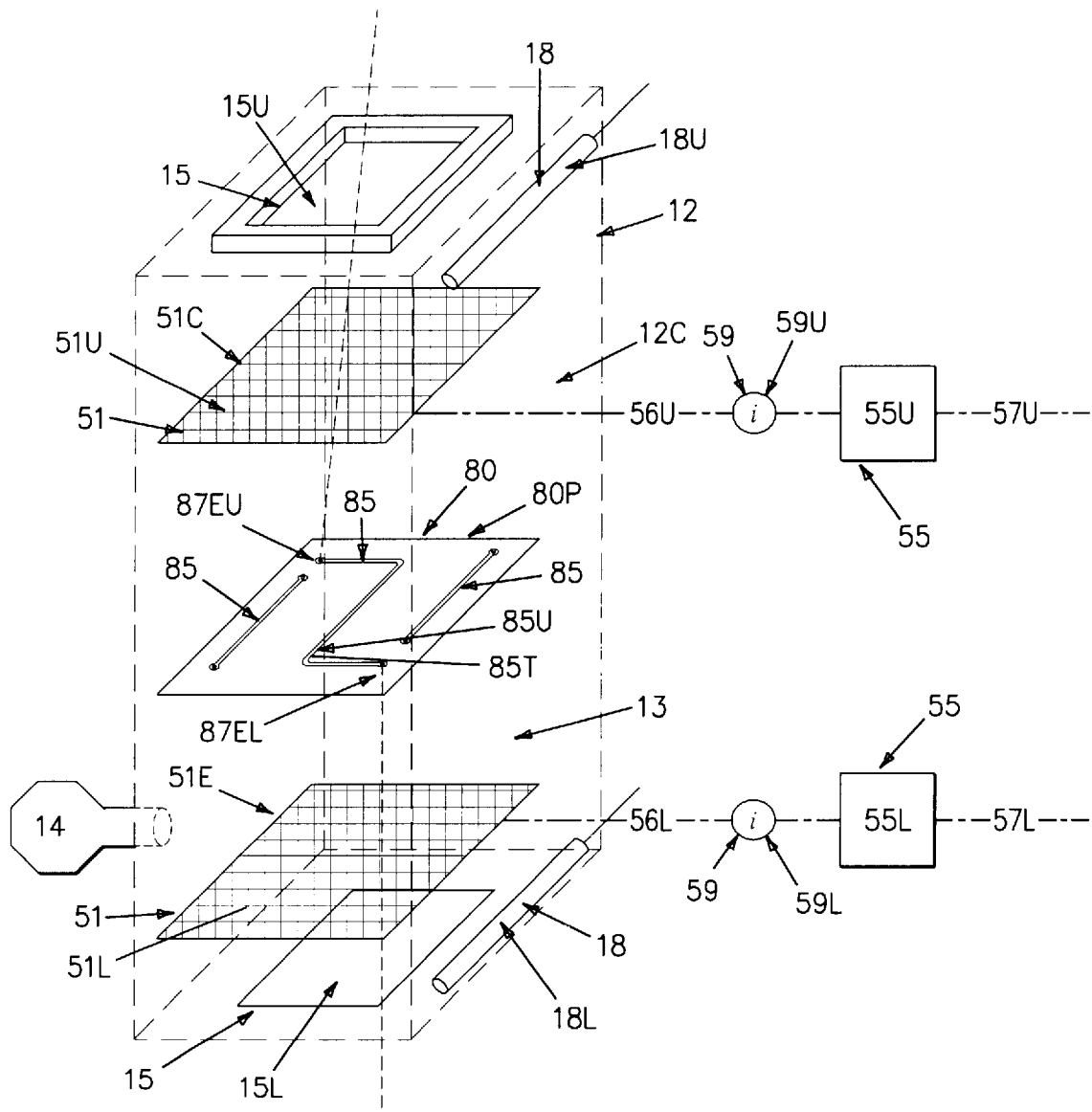
FIG. 2 is an enlarged view of the vacuum chamber and its contents of FIG. 1.

Referring also to FIG. 2, vacuum chamber means 12 may be of conventional, well-known design for creating and controlling the vacuum pressure in a test volume 13 at a specified value. Vacuum chamber means 12 includes: a chamber 12C enclosing a test volume 13; an evacuation means, such as vacuum pump 14 for lowering the pressure in test volume 13; doors, not shown, for access; and windows 15, such as upper window 15U and lower window 15L. The use of vacuum chamber 12 aids in the efficiency of tester 10.

Board 80P is placed in vacuum chamber 12 and supported by any suitable means that does not interfere with the working of tester 10. Vacuum pump 14 evacuates volume 13 to a rough vacuum.

Figure 3:
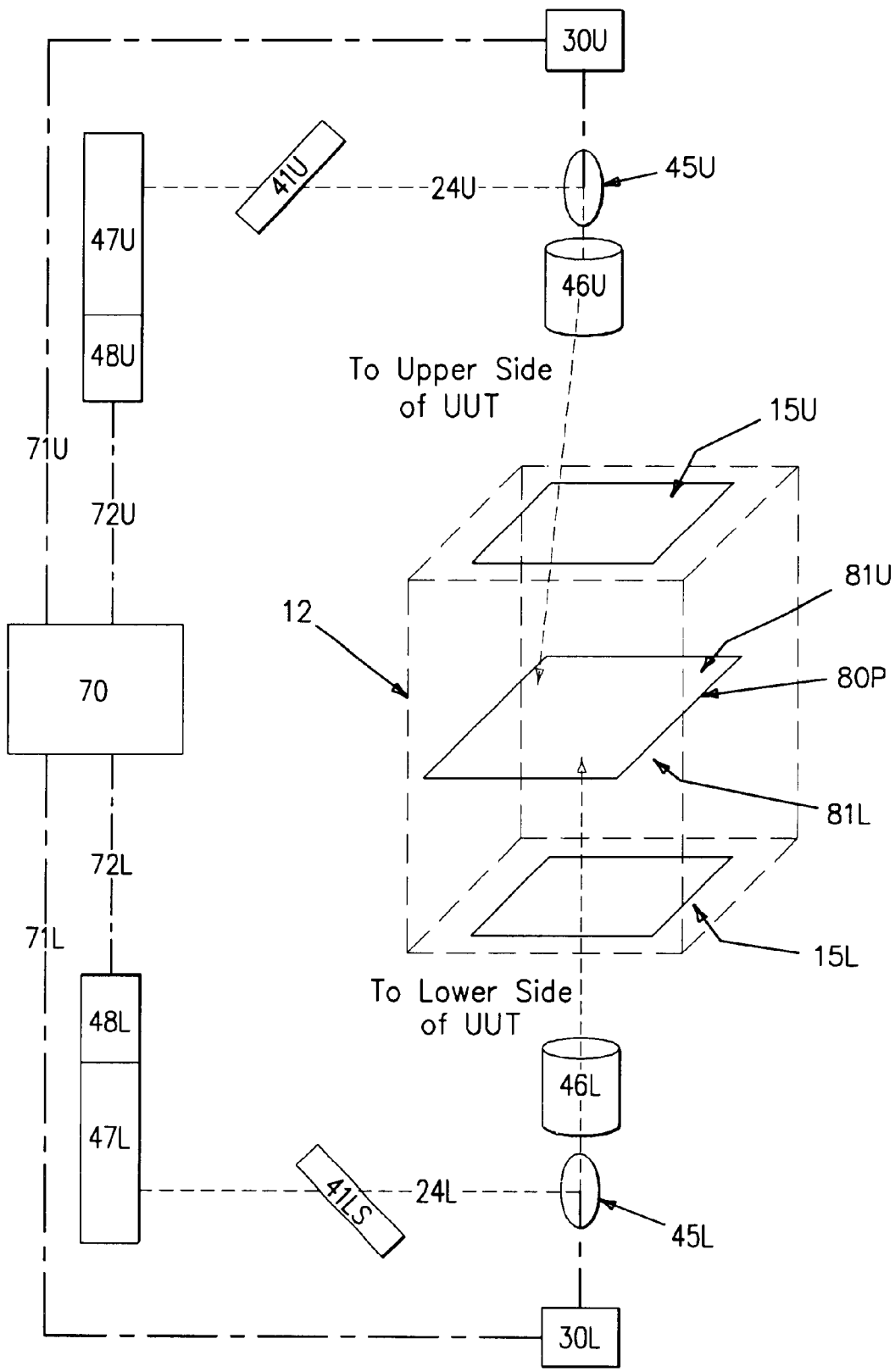
FIG. 3 is an enlarged representation of the image acquisition elements of FIG. 1.

Image Acquisition. FIG. 3 is an enlarged representation of the image acquisition elements of FIG. 1 by which tester 10 determines the location of test trace 85T in chamber 12C relative to the optical path components. Preferably, the initial accuracy of either manual or machine placement of board 80P within chamber 12 is approximately +/−0.040 inch. The precise location of placement of board 80P is determined through the use of image acquisition. Controller 70 includes a computer and contains a mapping of traces 85 and other indicia on board 80P. Controller 70 via path 71U directs upper servo mechanism 30U which in turn will rotate upper galvo beam mirror 45U to a predetermined position that will capture the image of a fiducial, a recognizable feature, on upper side 81U of board 80P. This image will be reflected through scan lens 46U, upper galvo beam mirror 45U, through upper high reflector 41U, and through upper telescope vision system 47U to upper CCD acquisition system 48U which is connected by line 72U to controller 70. The actual position of the fiducial will be compared to the position data supplied by controller 70. This process will be repeated for a second and perhaps a third known fiducial. The resulting data will provide an X,Y offset and/or scaling factor that will be applied to position data for each of the upper end pads 87EU of test traces 85T on board 80P.

In a like manner, controller 70 via line 71L will direct lower servo mechanism 30L, which in turn will rotate lower galvo beam mirror 45L to a predetermined position that will capture the image of a fiducial on the lower side 81L of board 80P. This image will be reflected through scan lens 46L, lower beam galvo beam mirror 45L, through first lower high reflector 41LS, and through the lower telescope vision system 47L to the lower CCD acquisition system 48L which is connected by line 72L to controller 70. The actual position of the fiducial will be compared to the position data supplied by controller 70. This process will be repeated for a second and perhaps a third known fiducial. The resulting data will provide an X,Y offset and/or a scaling factor that will be applied to position data for each of the lower end pads 87EL of test traces 85T on board 80P.

Performing this task on both sides of board 80P not only corrects for inaccuracy of positioning of board 80P, but, in addition, accounts for any inaccuracy of registration or alignment of the pattern of the traces on the upper side 81U of board 80P versus the pattern of the traces on the lower side 81L of board 80P, as well as material stretch and shrinkage.

In this manner, controller 70 knows the physical position of traces 85 on board 80P relative to optical path components.

Figure 4:
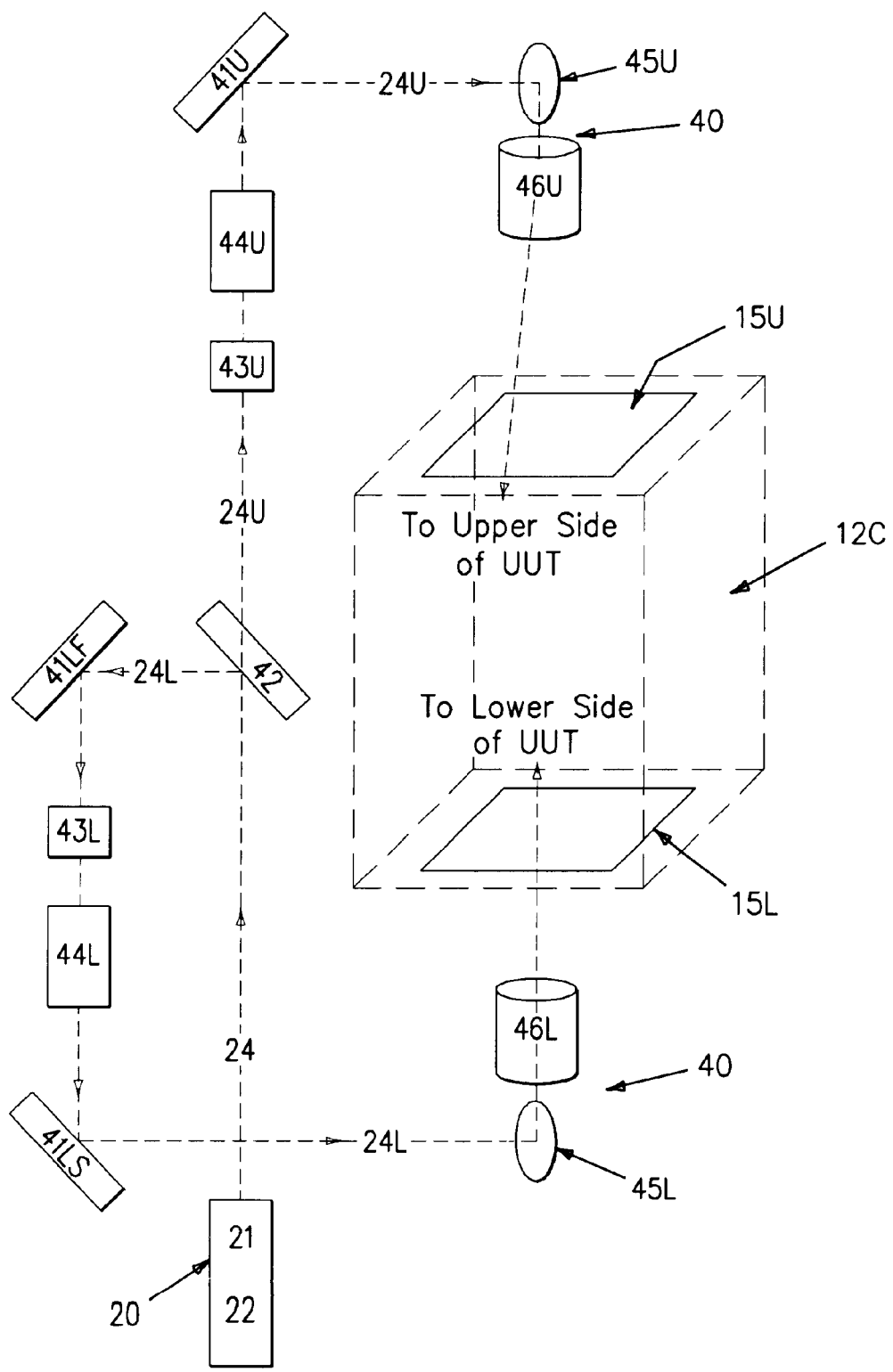
FIG. 4 is an enlarged representation of electromagnetic source means and the optical beam path elements of FIG. 1.

Optical Beam Path. FIG. 4 is a enlarged representation of the electromagnetic source means 20 and optical beam path elements of FIG. 1. Electromagnetic source means 20 generally comprises a source of electromagnetic radiation 21, such as ultraviolet laser 22, for producing a beam 24 of electromagnetic radiation such as of ultraviolet light, and optical path components 40, including a beam splitter 42 for splitting beam 24 into upper and lower beams 24U, 24L, for directing beams 24U, 24L onto chamber 12C. Although a single source 21 is shown for producing beams 24U, 24L, multiple sources could be used. Laser 22 may be continuous wave, pulsed, q-switched or mode-locked. Q-switched is preferred.

Upper beam 24U passes through upper shutter 43U and upper beam conditioning optics 44U, off upper high reflector 41U, to upper galvo beam mirror 45U, then through upper scan lens 46U, window 15U, and the upper electrode 51U, to a specific target, such as on test trace 85T, such as an end pad 87E.

Scan lenses 46U and 46L have been designed for a flat focused field while maintaining both the visual and the UV wave lengths in the same scan area.

Shutters 43U and 43L are used to control the time of testing by allowing beams 24U and 24L to illuminate the end pads 87EU and 87EL of trace 85T for specific time periods. The shutters 43U and 43L may be electromechanical, piezo electrical, acousto-optic or electro-optic.

Lower beam 24L reflects off first lower high reflector 41LF, passes through lower shutter 43L and lower beam conditioning optics 44L, off second lower high reflector 41LS, to lower galvo beam mirror 45L, then through lower scan lens 46L and window 15L. Galvo beam mirrors 45U, 45L are directed by upper and lower servo mechanisms 30U, 30L to deflect beams 24U, 24L to the desired target. Servo mechanisms 30U, 30L are connected to controller 70 by connectors 71U, 71L. Controller 70 has a mapping of all traces 85 on board 80P and is programmed to sequentially control and move beams 24U, 24L at selected times to desired test targets.

Preferably, beams 24U, 24L entering windows 15U, 15L are of small cross-section, such as focused to approximately 0.003 inch or less in diameter over the entire area of board 80P, and are capable of producing the photoelectric effect on targets, thereby liberating electrons, sometimes referred to as photoelectrons, therefrom.

Electrode circuit 50 includes electrodes 51, such as upper electrode 51U and lower electrode 51L, and associated electronics 55U, 55L. In the preferred embodiment, electrodes 51U, 51L are grids 52U, 52L of 0.001 inch or smaller wire 53 interlaced on a 0.015 inch or tighter pitch. Grids 52U, 52L are situated above and below board 80P at distance of approximately 5 mm and lie over and under traces 85. Testing can be accomplished with both larger and shorter separation distances.

Alternate types of electrodes 51 include etched plates or film sheets. A plate electrode comprises a transparent plate, such as of glass, having a conductive grid pattern, such as of chromium, deposited and etched on the side facing board 80P. A film sheet electrode comprises a thin, transparent conductive film sheet, having the surface that is facing board 80P coated (e.g. sputtered) with a controlled amount of conductive metal in the form of a thin conductive, such as metallic, coating that is sufficiently transparent to the beam.

Electrode electronics 55U, 55L provide voltages to electrodes 51U, 51L on lines 56U, 56L respectively as well as analyze currents through electrodes 51, such as with meters 59, such as ammeters 59U, 59L. Results amassed from the grid electronics are forwarded to the controller 70 on lines 57U, 57L respectively for display and/or recording.

In some applications one electrode 51, such as upper electrode 51U acts as a collector, i.e. a collector of electrons, if the near trace 85 is of lower potential, and one electrode 51, such as lower electrode 51L acts as an emitter, i.e. an emitter of electrons, if the near trace 85 is of higher potential.

Initialization of circuit board prior to test. Typically, board 80P and traces 85 are initially at an unknown voltage. The initial board and trace voltages may be due to static electricity build-up during handling, movement, or vacuum pump-down. For test purposes, it is desirable to provide board 80P and traces 85 with a known voltage initial condition so that reliable, predictable and repeatable tests can be performed. It has been found that well-known means in the art do not work reliably. For example, the common practice of passing the board 80P through grounding rollers to give board 80P and traces 85 a zero or neutral voltage does not work reliably because subsequent operations, performed on board 80P before test, such as movement into chamber 12C and vacuum pump-down, may induce static electricity to be formed on board 80P and/or traces 85. Therefore the following methods are used to place all traces 85 at a known initial voltage.

One method of voltage initialization of board 80P and traces 85 is by induced high voltage. In this method, all traces 85 are given a known voltage by applying a relatively high positive voltage in the range of 500 to 2,000 volts to one electrode 51 making it a collector 51C while at the same time applying high negative voltage in the range 500 to 2,000 volts to the other electrode 51 making it an emitter 51E such that the resulting high potential field in the presence of natural background electrons initiate an electron flow to be emitted from the emitter electrode 51E and travel towards the more positive collector electrode 51C. Since board 80P is interposed in the space between electrodes 51, many of the electrons strike board 80P, and many electrons are then emitted by board 80P to travel towards collector 51C. If the voltages on collector 51C and emitter 51E are switched off rapidly, some electrons will remain on board 80P and will collect on traces 85, thereby charging traces 85 to a known voltage, which is proportional to the applied voltages. Reversing the polarity of the voltages applied to electrodes 51 ensures that all traces 85 on both sides of board 80P will be charged to the same voltage. Circuitry to accomplish such switching is straightforward and well known in the art. The voltage at which photoelectron currents, as measured by the electrode electronics 55, drops to zero is the residual voltage remaining on traces 85.

Another method of voltage initialization of board 80P and traces 85 is by simultaneous photoelectron effect illumination of electrodes 51 and traces 85. Electrodes 51 are set to a known positive voltage in the range 5 to 300 volts. Upper broadband UV electromagnetic source 18U is positioned to irradiate board upper side 81U and above. Lower broadband UV electromagnetic source 18L is positioned to irradiate board lower side 81L and below. The broadband UV electromagnetic sources 18U, 18L are flashed so that the photoelectric effect causes photoelectrons to be liberated from all traces 85, electrodes 51 and all other metal surfaces in the vicinity, such that electrons will flow in various directions as determined by the known voltages on electrodes 51 and the unknown voltage on traces 85 until traces 85 are charged to the same voltage as electrodes. Satisfactory broadband UV electromagnetic sources 18 are UV lamps emitting light with wavelengths of 300 nanometers or less.

Another method to give known voltage to traces 85 is to use the laser method where the ultraviolet laser 22 and optical path components 40 are used to simultaneously illuminate a spot on electrode 51 and an individual trace 85T with beam 24U or 24L, after setting electrode 51 to a known voltage in the range of 10 to 100 volts, such that photoelectrons are liberated from electrode 51 and trace 85T and flow until trace 85T is at the same potential as electrode 51. In practice, when electrodes 51 are wire grids 52 or equivalent, beam 24L, 24U may be dithered using controller 70 and galvo beam mirror 45U or 45L to insure that beam 24U, 24L strikes a portion of electrode 51 while the center of motion is aimed at target test pad 87EU or 87EL. This method charges only one trace 85 at a time, so the process described must be repeated for each trace 85. Additionally, each end 87E of each trace 85 must be illuminated by beam 24U or 24L to ensure that a uniform voltage is applied to traces 85 which may have an open circuit.

Test for Continuity. In a preferred method of testing trace 85 for continuity between two points, electrode electronics 55U maintain both electrodes 51 as collectors 51C at a given potential for collecting electrons liberated by the photoelectric effect of beams 24U, 24L on trace 85. A first location on trace 85, such as on upper end pad 87EU, is interrogated by beam 24U. This charges the first location to a voltage level equal to that of the upper collector 51C. When this voltage level has been achieved as best evidenced by no further current flow between trace 85 and collector 51C, beam 24U or 24L is then directed to another location, such as opposite end pad 87EL of trace 85. If the second end point is charged, to the same voltage level such that no current is detected, then it may be assumed that continuity exists between the first and second locations. Conversely, if a current is detected then the second location does not exhibit a charge level equal to that of collector 51C and it may be assumed that an open circuit has been detected and the system will display and/or record this as a defect. Each trace 85 is tested for continuity in this manner.

Test for shorts. The test for shorts is performed in a manner similar to that described above of determining continuity or opens. Immediately after determining the validity of a trace for continuity, i.e. no opens, locations, such as end pads 87E of adjacent traces may be interrogated to determine their voltage levels. If the adjacent trace does not exhibit a voltage level equal to that of the collector then it may be assumed that the adjacent trace is isolated from the initial trace. If an adjacent trace exhibits a voltage level equal to that of the initial trace, such as by meter 59 showing no current flow, then it may be assumed that a short exists between the two traces allowing the second trace to charge to collector voltage level simultaneously with the initial trace. Tester 10 will display and/or record this as a defect.

All adjacent traces must be tested in a like manner to assure that the initial trace tested is not shorted to any other trace on Board 80P.

A further advantage of the invention is the ability to quickly retest individual traces 85T which may have failed initial testing. In this case, the method is as described earlier except that initial charging to a known voltage is performed with the laser method using the beam 24U or 24L since not all traces must be recharged, only those that failed initial testing.

Measurements. During measurements of opens or shorts, when collecting electrons emitted from a trace 85 on the side of board 80P facing electrodes 51, the voltage on electrode 51 must be set to a positive value higher than the residual voltage left on traces 85 during initial charging. It has been found that during the test of a trace 85 when beam 24U or 24L is directed to top pad 87EU or to bottom pad 87EL, photoelectrons will be liberated faster and travel to a collector electrode 51C faster if the voltage on the opposite electrode 51 is switched to a relatively high negative value, such as −100 to −300 volts, creating a large electric field. The increase in collection speed means more tests per unit of time can be performed.

When using either the UV lamps 18U and 18L or UV laser 22 for charging of all traces 85 to a known initial voltage, voltages on collectors 51C may be in the range 5 to 300 volts during measurements of opens and shorts. When beam 24U is directed to top end pad 87EU preferably upper electrode 51U is set to positive 100 volts while opposite electrode 51L, is set to negative 150 volts. When beam 24L is directed to bottom end pad 87EL, preferably lower electrode 51U is set to positive 100 volts while upper electrode 51U is set to negative 150 volts.

Although a particular embodiment of the invention has been illustrated and described, various changes may be made in the form, composition, construction, and arrangement of the parts herein without sacrificing any of its advantages. Therefore, it is to be understood that all matter herein is to be interpreted as illustrative and not in any limiting sense, and it is intended to cover in the appended claims such modifications as come within the true spirit and scope of the invention.

We claim:

1. A tester for testing an electrical trace on a board capable of test without physically contacting the electrical trace comprising:
    a board having a first planar side and an opposing second planar side and an electrical trace formed on at least one planar side, said electrical trace having electrical continuity with both said first planar side and said second planar side;
    an electromagnetic source to direct a first beam of electromagnetic radiation on said first planar side to contact said electrical trace thereby producing a photoelectric effect thereon and to direct a second beam of electromagnetic radiation on said second planar side to contact said electrical trace thereby producing a photoelectric effect thereon;
    an electrode circuit including a first grid electrode disposed near said first planar side and a second grid electrode disposed near said second planar side; said electrode circuit for maintaining said electrode as a given potential for collecting electrons liberated by the photoelectric effect of the beams on the electrical trace;
    a meter for measuring photoelectric current between said electrode circuit and the electrical trace.

2. The tester of claim 1, further including broadband electromagnetic source for simultaneously irradiating a plurality of electrical traces, said first grid electrode, and said second grid electrode with electromagnetic radiation for producing a photoelectric effect thereon.

3. The tester of claim 1 wherein said first grid electrode is substantially transparent to said beam.

4. The tester of claim 3 wherein said first grid electrode is a sheet electrode transparent to the beam including a surface facing the electrical trace having a thin conductive film thereon.

5. The tester of claim 1 further including:
    a vacuum chamber for containing said electrical trace.

6. A tester for testing for shorts between a first electrical trace and a second electrical trace on a board capable of test without physically contacting the electrical trace comprising:
    a board having a first planar side with a first electrical trace and an opposing second planar side with a second electrical trace, wherein said first and second electrical traces are electrically interconnected;
    electromagnetic source to direct a first beam of electromagnetic radiation on the first electrical trace thereby producing a photoelectric effect thereon and to direct a second beam of electromagnetic radiation on the second electrical trace thereby producing a photoelectric effect thereon;
    an electrode circuit including a first grid electrode disposed near the first electrical trace for collecting electrons liberated by the photoelectric effect of the first beam on the first electrical trace and a second grid electrode disposed near the second electrical trace for collecting electrons liberated by the photoelectric effect of the second beam on the second electrical trace; and
    a meter for measuring photoelectric current between said electrode circuit and the second electrical trace.

7. The tester of claim 6 further including broadband electromagnetic source for simultaneously irradiating a plurality of electrical traces, said first grid electrode, and said second grid electrode with electromagnetic radiation for producing a photoelectric effect thereon.

8. The tester of claim 6 wherein said first grid electrode is substantially transparent to said beam.

9. The tester of claim 8 wherein said first grid electrode is a sheet electrode transparent to the beam including a surface facing the electrical trace having a thin conductive film thereon.

10. A method of testing an electrical trace on a board capable of test without physically contacting the electrical trace comprising:
    providing a board having a first planar side and an opposing second planar side and an electrical trace on at least one planar side, said electrical trace having electrical conductivity from both said first planar side and said second planar side;
    disposing a first grid collector electrode of an electrode circuit near said first planar side for collecting electrons liberated by photoelectric effect on the electrical trace;
    measuring photoelectric current between said first grid collector and said electrical trace;
    disposing a second grid collector electrode of said electrode circuit near said second planar side for collecting electrons liberated by photoelectric effect on said second location on said electrical trace;
    maintaining the first and second grid collector electrodes at a known potential; and
    directing a first electromagnetic beam on said first planar side to contact said electrical trace thereby producing a photoelectric effect on the electrical trace until the electrical trace is charged to a known potential;
    directing a second beam of electromagnetic radiation on said second planar side to contact said electrical trace thereby producing a photoelectric effect thereon; and
    measuring photoelectric current between said electrical trace and said second grid collector electrode.

11. The method of claim 10 further including the step of:
    disposing said board and said first and second grid collectors in a vacuum chamber before directing said first and second beams.

12. The method of claim 10 further including the step of:
    initializing said at least one electrical trace to a known voltage before directing a first electromagnetic beam on said first planar side to contact said electrical trace.

13. The method of claim 12 wherein the step of initializing said at least one electrical trace includes:
    irradiating said at least one electrical trace and said first grid collector electrode with a broadband electromagnetic source for producing a photoelectric effect thereon.

14. The method of claim 10 further including:
    supplying a positive potential to said second grid collector electrode.

15. The method of claim 14 wherein the step of initializing said at least one electrical trace includes:

dithering an electromagnetic beam on said at least one electrical trace and said first grid collector electrode until said at least one electrical trace is charged to a known potential.

16. The method of claim 10 further including:

maintaining said second grid collector electrode at a known potential.

17. The method of claim 16 further including the step of:

initializing the trace to a known voltage before directing a first electromagnetic beam on a first location on a trace.

\* \* \* \* \*